United States Patent [19]

Zulehner

[11] 4,330,362

[45] May 18, 1982

[54] DEVICE AND PROCESS FOR PULLING HIGH-PURITY SEMICONDUCTOR RODS FROM A MELT

[75] Inventor: Werner Zulehner, Emmerting, Fed. Rep. of Germany

[73] Assignee: Wacker-Chemitronic Gesellschaft für Elektronik-Grundstoffe mbH, Munich, Fed. Rep. of Germany

[21] Appl. No.: 240,537

[22] Filed: Mar. 4, 1981

Related U.S. Application Data

[63] Continuation of Ser. No. 31,553, Apr. 19, 1979, abandoned.

[30] Foreign Application Priority Data

May 17, 1978 [DE] Fed. Rep. of Germany ....... 2821481

[51] Int. Cl.³ .............................................. C30B 15/22
[52] U.S. Cl. ................................ 156/617 SP; 422/249
[58] Field of Search .................... 156/617 SP, 608; 422/246, 249

[56] References Cited

U.S. PATENT DOCUMENTS

| | | | |
|---|---|---|---|
| 3,265,469 | 9/1966 | Hall | 156/608 |
| 3,359,077 | 12/1967 | Arst | 156/617 SP |
| 3,511,610 | 5/1970 | Dohmen | 422/249 |
| 3,615,878 | 10/1971 | Chang et al. | 156/617 SP |
| 3,692,499 | 9/1972 | Andrychuk | 422/249 |
| 4,157,373 | 6/1979 | Berkman et al. | 422/249 |

FOREIGN PATENT DOCUMENTS

48-46578 8/1973 Japan .......................... 156/617 SP

*Primary Examiner*—Gregory N. Clements
*Attorney, Agent, or Firm*—Allison C. Collard; Thomas M. Galgano

[57] ABSTRACT

In the crucible pulling of silicon according to the Czochralski technique, silicon monoxide forms as a result of the silicon melt reacting with the quartz crucible containing the melt, and evaporates and deposits in the form of solid particles on the upper edge of the crucible, on the monocrystalline rod, on the walls of the vessel, and also on recharging devices in the upper pulling chamber. These solid particles can fall back into the melt and then cause dislocations and polycrystalline growth in the growing silicon rod. As a result of the reaction of the carbon of the hot graphite parts with silicon monoxide, carbon monoxide is also formed and this partially diffuses into the melt and gives rise to carbon impurities in the silicon rod. In addition, because of heat irradiation from the inner wall of the quartz crucible as it becomes more empty, high pulling speeds, such as those usual in crucible-free zone pulling, cannot be obtained. These disadvantages of the conventional crucible-pulling process are effectively obviated according to the invention by a pot-like device which entails a partial covering of the melt surface, the crucible and the space laterally adjoining the crucible.

12 Claims, 1 Drawing Figure

U.S. Patent    May 18, 1982    4,330,362
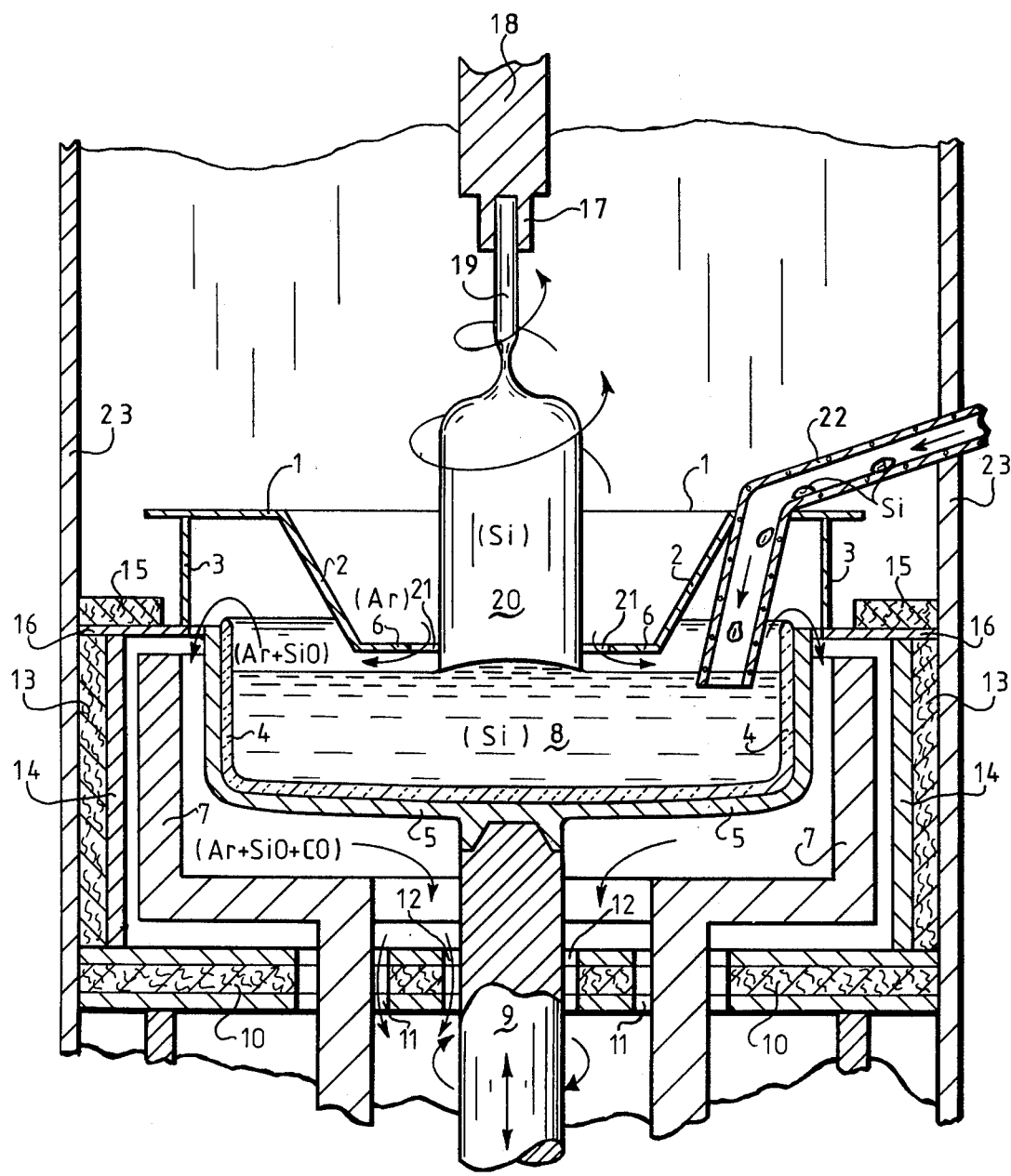

DEVICE AND PROCESS FOR PULLING HIGH-PURITY SEMICONDUCTOR RODS FROM A MELT

This application is a continuation of application Ser. No. 31,553, filed Apr. 19, 1979, abandoned.

The invention relates to a device and a process for the partial covering of a crucible and the semiconductor melt contained in the crucible during the pulling of crystalline semiconductor rods in accordance with the Czochralski crucible pulling technique.

When pulling silicon crystals from the melt in accordance with the known Czochralski crucible-pulling technique, volatile silicon monoxide is formed by the reaction of the silicon melt with the quartz crucible containing the melt. The volatile silicon monoxide condenses and is deposited on the cooler crucible edge, on the silicon crystal, on the pulling shaft and on the internal walls of the pulling reactor. If such condensed silicon monoxide condensates or agglomerates fall into the melt as the crystal is being pulled, they lead to crystal faults in the growing silicon monocrystal or even cause a solely polycrystalline growth. By means of a process according to DE-OS No. 25 48 046, according to which protective gas is admitted during the pulling operation through a concentric tube surrounding the pulling shaft, the condensation of silicon monoxide on the crystalline rod and on the upper pulling shaft can, in fact, be prevented and reduced at the crucible edge but not in the pulling zone and, in particular, not on recharging devices located in the pulling chamber. The problem of silicon monoxide agglomerates condensing on the walls of the vessel and, in particular, on the recharging devices is also not solved by a device such as the one described in DE-OS No. 16 19 966 in which a cover is so arranged over a semiconductor melt that condensed solid particles from the evaporated melt fall onto the cover and not back into the melt. If a pulling arrangement having such a cover is operated with a recharging device then, if recharging needs to be carried out, the cover over the melt surface has to be pushed to one side. During the remelting of solid silicon or during the addition of liquid silicon, silicon monoxide agglomerates adhering to the recharging device fall onto the melt surface and, as the pulling process continues, may give rise to growth faults or even to polycrystalline growth of the silicon rod being pulled from the melt.

A further problem encountered during crucible pulling is the reflux of carbon monoxide onto the silicon melt. The carbon monoxide is formed during the crystal pulling as a result of a reaction between carbon from the graphite parts of the heating device, or from the graphite crucible surrounding the quartz crucible, and silicon monoxide. Even though these gases are normally continuously pumped out of the pulling reactor through an outlet at the bottom of the reactor, this measure alone does not prevent part of the gases from reacting with the silicon melt. During crystal pulling, the carbon dissolved in the melt is incorporated in the growing silicon rod as a result of its diffusion coefficient of 0.07. However, the carbon gives rise to crystal faults in the solid silicon, such as carbon swirls in particular, which have an adverse effect on the properties of components manufactured from such material.

Because of the poor heat dissipation through the rod, pulling speeds that are customary in crucible-free zone pulling cannot be, even approximately, attained in the crucible pulling process. The reason for this lies, in particular, in the thermal irradiation from the crucible wall onto the growing silicon rod. This thermal irradiation, which stems less from the surface of the melt than from the crucible wall, increases during the pulling process as the surface of the melt drops and exposes the heat-radiating surface of the crucible. This thermal irradiation and the resultant high temperatures at the rod additionally promote the formation of swirl defects.

The present invention was based on the task of reducing or, if possible, completely eliminating, the above-mentioned factors adversely affecting the crucible-pulling process according to the Czochralski technique, by the utilization of suitable means.

This problem is solved in accordance with the present invention by covering the melt, the crucible and the space laterally adjoining the crucible during the crystal pulling by a device consisting of an upper flat annular rim projecting beyond the edge of the crucible and, attached to the annular rim, a joining piece which extends downwardly from the inner edge of the annular rim and which is either cylindrical or conically tapered in shape. The internal height of the joining piece is 0.2 to 1.2 times the depth of the crucible and its bottom opening is 1.2 to 8 times the cross-sectional area of the semiconductor rod to be pulled.

The invention is explained in more detail with reference to the drawing. The drawing illustrates schematically the essential parts of a pulling assembly for the crucible-pulling of semiconductor rods according to the Czochralski technique, together with the preferred embodiment of the device according to the invention.

Referring now in detail to the drawing, the device according to the invention consists of a pot-like structure, open at the bottom, with which the semiconductor melt, the crucible and the space laterally adjoining the crucible are covered during the crystal pulling. The reflux of gases emerging from the melt, or evolved in the furnace zone, onto the melt can be effectively suppressed by this device if a suitable flow rate and pressure of the protective gas are set.

The device according to the invention is expediently manufactured of a metal or a material having a metallic surface, to reflect infrared radiation. Tungsten, niobium and tantalum are suitable metals for example, or, if germanium rods are being pulled, also steel or nickel. Molybdenum in sheet form is generally preferred however, because of its favorable properties and because it is comparatively inexpensive to obtain.

According to the preferred embodiment of the device according to the invention, an upper flat annular rim 1 projecting beyond the crucible edge has an internal diameter which is smaller than the internal diameter of the melt crucible, and an external diameter which is greater than the external diameter of the melt crucible which consists of a quartz crucible and a susceptor surrounding the quartz crucible; that is to say, it is sufficiently large at least to cover the inner opening of the furnace zone but is naturally still small enough to fit inside the vessel. In other words, the external diameter of this rim may not be larger than the internal diameter of the vessel. The joining piece attached to this annular rim and extending downwardly from the inner edge of the rim is either cylindrical or, preferably, conically tapered. In the latter case, the included angle between opposite surface lines of the frustoconical joining piece (i.e., from surface line to surface line as measured from the cone apex) is about 0° to 150°, preferably 10° to 120° (with 0° representing the cylindrical configuration).

Externally, the joining piece 2 is preferably partially surrounded by one or several cylindrical tubular sections 3 which are connected in a gas-tight manner to the underside of the annular upper rim 1; the internal diameter of the cylindrical tubular section of sections being greater than the external diameter of the melt crucible. In this context, the melt crucible comprises a combination of a quartz crucible 4 containing the melt and a graphite crucible or susceptor 5 surrounding the quartz crucible. The height of the cylindrical tubular section or sections corresponds, in the preferred embodiment, to approximately 0.2 to 0.8 times the internal height of the joining piece 2. In the pulling of germanium rods, a cylindrical tubular section may be unnecessary because no volatile germanium oxides are able to form during this process and, accordingly, the carbon monoxide problem does not occur to the same extent.

According to the preferred embodiment, at the bottom end of joining piece 2 there is a flat, annular, inwardly-directed projection 6 disposed parallel to upper annular rim 1. The width of this projection, or pulling screen, approximately corresponds to 0.05 to 0.35 times the internal diameter of the melt crucible.

The remaining furnace construction of the pulling assembly essentially corresponds to systems in current use. In particular, the furnace construction also includes a heating element 7 made of graphite which melts pieces of silicon that have been introduced into the melt crucible consisting of quartz crucible 4 and the surrounding graphite susceptor 5 and which maintains the resulting melt 8 at the required temperature during the pulling process. The melt crucible rests on a crucible shaft 9 made of graphite by which it can be rotated and moved vertically. The furnace zone is sealed off at the bottom by a heat insulator consisting of several layers of graphite and carbon felt 10 in which are provided openings 11 and 12 for the heating element 7 and the crucible shaft 9; these openings at the same time permitting gases to be discharged. At the sides, the furnace zone is defined by another graphite tube 14 externally insulated with carbon felt 13. On the top of graphite tube 14 there rests a graphite ring 16 sealed off with carbon felt 15.

The dimensions of the device according to the invention (comprising elements 1, 2, 3 and 6) are matched to the furnace section and the crucible of a specific pulling assembly in such a manner that the crucible can be raised between the parts 2 and 3 during the rod-pulling operation and, at the end of the pulling operation, comes to rest with its upper edge approximately a few millimeters below the upper rim 1 of the device according to the invention to permit gas to flow through the gap defined therebetween (for which purpose a gap of approximately 5 mm should be sufficient to prevent accumulation of gas). The distance between the melt and the bottom projection of the so-called pulling screen 6 of the device according to the invention is advantageously approximately 2 to 40 mm (preferably, about 5 to 15 mm) and is substantially dependent on the desired temperature distribution in the rod and the melt and on the flow rate and pressure of protective gas in the furnace zone. This distance is preferably held constant after the pulling of the conical portion, i.e., during the pulling of the cylindrical portion of the rod. Sometimes, however, it may be of advantage to vary this distance during the pulling, especially when it is necessary to compensate for changing conditions, caused by the growing rod length and the decreasing melt level.

Tubular section 3 of the device according to the invention, with which the device is supported on graphite ring 16 of the furnace part, is also not needed during the pulling of silicon when, in its highest possible position, the melt crucible does not project beyond graphite ring 16. This is the case, for example, when the lateral limitation 14, i.e., the graphite tube surrounding the furnace part, is correspondingly higher or when a correspondingly thicker graphite ring 16 is placed as an upper closure on the graphite tube.

The actual process sequence is as follows: when quartz crucible 4 filled with polycrystalline silicon has been placed in graphite crucible 5, the cover device according to the invention is placed on graphite plate 16 and, in order to melt the polycrystalline silicon, the melt crucible is raised from below so far toward the cover device that the granulated silicon is only a few millimeters away from the lower edge of joining piece 2, to which, preferably, the pulling screen 6 is attached. During the melting of the granulated silicon, the crucible is raised to the same extent as the level of the polycrystalline silicon in the crucible falls as a result of being melted. Advantageously, the crucible is not rotated during the melting to avoid possible movement of the cover device from its position by any particularly exposed projecting piece of silicon.

As soon as the melting is complete, the surface of the silicon melt 8 is brought to the required distance from the lower part or pulling screen 6 of the cover device according to the invention by further raising the quartz crucible 4 so that the distance between the melt and bottom surface of pulling screen 6 is approximately 2 to 40 mm and, preferably, about 5 to 15 mm. When the commencement temperature has been reached, a seed crystal 19 joined via a mounting 17 to an upper pulling shaft 18 is dipped into the melt and the pulling process is commenced. The starting operation with the pulling of the thin neck and the tapered portion of the rod does not differ from conventional crucible pulling according to the Czochralski technique.

In contrast with conventional crucible pulling, however, when a suitable pulling speed has been set the rod can be pulled for its entire length at a constant speed because, as a result of the device according to the invention, the temperature ratios change only slightly in the vicinity of the solidification front during the course of the rod pulling.

When using the highest possible pulling speed, the pulling of the rod will naturally have to be slowed down somewhat towards the end as is otherwise generally usual. In crucible pulling without the cover device according to the invention, the pulling speed has to be reduced very early during pulling of the rod. This is because, as the surface of the melt drops, heat from the exposed crucible walls is increasingly radiated onto the rod and its solidification is thus delayed, and, at the same time, the output of the heater has to be constantly increased because the crucible is continuously being moved out of the heater as the amount of melt decreases. The process according to the invention effectively prevents this by the use of the cover device which screens the rod by reflecting the heat irradiated from the exposed crucible walls.

During the melting of the granulated silicon and during the actual pulling process, a protective gas, for example, argon or helium, is admitted to the reactor, above the cover device, under a pressure of approximately 0.5 to 1000 mbar, preferably between 5 to 20 mbar. This protective gas flows between the bottom opening of the cover, or through the gap 21 formed between the silicon rod 20 and the pulling screen 6 and across the surface of the melt, thus entraining silicon monoxide (see arrow for AR+SiO) and, outside the crucible, also carbon monoxide (see arrow for AR+SiO+CO). As a result of the difference in pressure caused by the constant pumping away of gases through the base plate of the reactor, it is then discharged from the furnace part of the pulling assembly through gaps 11 and 12, and is removed from the reactor through its base plate lying below the pulling assembly. The flow rate of the inert gas is naturally dependent on the geometric relationships in the particular pulling reactor and on the amount of melt, and lies between approximately 100 and 2000 l/h (measured at standard temperature and pressure). During the admission of this gas, it must be ensured that the unidirectional flow that has been set is maintained and that reflux or rediffusion of the silicon monoxide and carbon monoxide into the melt or into the zone above the annular gap does not occur. During the rod pulling, the crucible may be recharged with silicon. For example, silicon granules may be fed through a heated quartz tube 22, which passes from the outside through the vessel wall 23 and the outer portion or rim 1 of the device according to the invention. The silicon granules would then be immersed in the silicon melt 8.

According to the process of the invention, pulling speeds of between 2 and 3 mm per minute and more are already being achieved with 80 mm diameter rods, for example. Moreover, by optimizing the geometric relationships and the pulling parameters, even higher pulling speeds could definitely be achieved.

By reducing or avoiding silicon monoxide condensation in the zone above the melt, it is possible to reduce substantially the dislocation rate in the pulling of monocrystals. This also permits devices of all kinds to be installed for example, recharging devices for granulated silicon, devices for melting polycrystalline rods or for admitting more liquid silicon, or for admitting dopants, without the pulling of the monocrystal being disrupted by particles of silicon monoxide condensate falling into the melt.

Since the reflux of carbon monoxide into the melt is effectively suppressed according to the invention, the carbon content of crucible-pulled silicon can be substantially reduced. Another advantage is that high-temperature precipitations, which give rise to point defects, can be reduced by lowering the rod temperature following a relatively large drop in temperature behind the solidification front, caused by the cover device of the invention. As a result of the more uniform temperature drop in the rod and the more uniform pulling speed during the pulling operation, a more uniform crystal quality than has previously been possible can be obtained over the entire length of the rod.

By virtue of the cover according to the invention, radiation of heat onto the cooled reactor wall above the pulling zone is substantially prevented. As a result, the heat output can be reduced by approximately 30 to 40%, which, in addition to the increased pulling speeds contributes to improved economic viability of the process. The invention is suitable for the manufacture of monocrystals, especially silicon monocrystals, and polycrystalline semiconductor material for photovoltaic solar cells, especially those made of silicon. Even though the carbon monoxide problem or difficulties similar to those caused by depositions of silicon monoxide do not occur in the pulling of germanium rods, the process can nevertheless also be applied to this process to advantage. This is because, owing to the improved temperature screening, it permits considerably higher pulling speeds and thus increases the yield per pulling assembly and thereby the economic viability of the pulling process.

EXAMPLE OF APPLICATION

In a pulling assembly having a furnace structure and a cover according to the invention, as shown schematically in the drawing, a quartz crucible of 23 cm diameter and 18 cm depth was filled with 11 kg of polycrystalline silicon. Subsequently, a device according to the invention was placed centrally on the graphite cover plate of the crucible-pulling furnace. The dimensions of the device according to the invention were as follows: upper rim width 5 cm; external diameter of the upper rim 32 cm; height of the joining piece tapering conically downwards 16 cm, with an included angle from surface line to surface line of 16°; width of the lower rim (pulling screen) 3 cm; and height of the outer tubular section 10 cm. The tubular section was of 1 mm thick molybdenum.

The crucible filled with polycrystalline silicon was raised towards the cover device such that there was a space of only about 5 mm between the granulated polycrystalline silicon and the lower rim of the cover device according to the invention.

In this position, the polycrystalline silicon was melted under an argon atmosphere at a pressure of 10 mbar and at an argon flow rate of 800 l/h (measured at standard temperature and pressure). During the melting, the crucible was raised several times by the amount that the level of the polycrystalline silicon fell within the crucible as a result of the melting.

When melting was complete, the melt was brought into the commencement position, that is to say, the melt surface was situated approximately 10 mm below the lower portion of the cover device. In this position, when the commencement temperature had been reached, the seed crystal was dipped into the melt and the monocrystal was started in the usual manner and pulled to a diameter of about 80 mm.

In the cylindrical region of the rod, the crystal was pulled at a speed of 2.4 mm per minute at a crystal rotation speed of 15 rev/min and with rotation of the crucible in the opposite direction at a speed of 5 rev/min. The diameter of the pulling opening in the bottom inwardly projecting part of the cover was 120 mm. During the pulling in the cylindrical region of the rod, the distance between the melt and this bottom part of the cover according to the invention was maintained at approximately 10 mm.

When pulling the end portion, that is to say, as the pulling of the cylindrical rod was being finished by continuously reducing the diameter of the monocrystal to 0 mm, the crucible was lowered at the same pulling speed of 2.4 mm per minute.

The cylindrical length of the monocrystalline silicon rod obtained was 820 mm.

Thus, while only one embodiment of the present invention has been shown and described, it will be obvious to those persons of ordinary skill in the art, that many changes and modifications may be made thereunto, without departing from the spirit and scope of the invention.

What is claimed is:

1. In a process for the crucible pulling of crystalline semiconductor rods according to the Czochralski technique wherein crystalline semiconductor rods are pulled from a melt in a crucible, the improvement comprising:

covering the melt, the crucible and the space laterally adjoining the side of the crucible during the prior to crucible pulling by a one-piece cover device spaced above the surface of the melt including an upper flat annular rim which is positioned above the crucible, and spaced therefrom so as to allow for the escape of gas therebetween, said rim having an outer and inner peripheral edge and being dimensioned so that said outer edge thereof projects laterally beyond the outer crucible edge and extends over the space laterally adjoining the side of said crucible, and a joining member secured to, and depending downwardly from, said inner peripheral edge of said rim, said joining member having a bottom opening and being dimensioned such that the internal height thereof is about 0.2 to 1.2 times the depth of the crucible and such that said bottom opening thereof has a cross-sectional area which is about 1.2 to 8 times the cross-sectional area of the semiconductor rod to be pulled; and pulling a crystalline semiconductor rod from said melt in said crucible; and during the crucible pulling directing a protective gas stream along said rod in a direction generally opposite to that in which the rod is being pulled such that is flows downwardly through said bottom opening of said joining member, over the surface of the melt, then between said cover device rim and said crucible and over the edge of the crucible.

2. The process according to claim 1, additionally including the step of maintaining the space between the cover device and the melt surface constant during the crucible pulling of the cylindrical portion of the rod.

3. The process according to claim 2, additionally including the step of maintaining the melt surface at a constant level by raising the crucible during the crucible pulling of said rod.

4. The process according to claim 1, wherein said melt and said semiconductor rod comprise silicon.

5. A crucible and cover assembly for effecting the partial covering of a crucible and a semiconductor melt contained in the crucible during the pulling of crystalling crystalline semiconductor rods in accordance with the Czochralski crucible-pulling technique, comprising:

a crucible having an outer edge; and means for pulling a crystalline rod in an upward direction from a melt contained in said crucible;

means for feeding a protection gas stream in a downward direction along said rod being pulled, said means including a gas inlet and outlet;

a one-piece cover device having an upper flat annular rim which is positioned above said crucible spaced therefrom so as to allow for the escape of gas therebetween, said rim having an outer and inner peripheral edge and being dimensioned so that said outer edge thereof projects over and laterally beyond the outer crucible edge, and a joining member secured to, and depending downwardly from, said inner peripheral edge of said rim, said joining member having a bottom opening and being dimensioned such that the internal height thereof is about 0.2 to 1.2 times the depth of said crucible and such that said bottom opening thereof has a cross-sectional area which is about 1.2 to 8 times the cross-sectional area of the semiconductor rod to be pulled; and means for supporting said cover device in a position spaced above said crucible so as to allow for the escape of gas therebetween and so that, during the pulling of a crystalline semiconductor rod from a semiconductor melt contained in said crucible, and the feeding of a protective gas stream along the rod in a direction generally opposite to that in which the rod is being pulled, said cover device serves to protect said melt from falling condensate impurities generated during the pulling process and to direct said gas stream over the surface of the melt, then between said cover device rim and said crucible and over the edge of the crucible to suppress the reflux of harmful gases generated during the pulling process.

6. The assembly according to claim 1, wherein said joining member has a downwardly-tapered, frustoconical shape and is hollow.

7. The assembly according to claim 6, wherein the included angle between opposed surface lines of said frustoconical joining member as measured from the conical apex is from 10° to 120°.

8. The assembly according to claim 1, wherein said cover and the crucible are mounted in a vessel and wherein the external diameter of said upper flat annular rim projecting beyond the crucible edge is greater than the external diameter of said crucible, but is not more than the internal diameter of said vessel, and its internal diameter is smaller than the internal diameter of said crucible.

9. The assembly according to claim 5, wherein said joining member is externally partially surrounded by a cylindrical tubular section connected in a gas-tight manner to the underside of said annular upper rim, the internal diameter of said cylindrical tubular section being greater than the external diameter of said crucible.

10. The assembly according to claim 9, wherein the height of said cylindrical tubular section corresponds to about 0.2 to 0.8 times the internal height of said joining member.

11. The assembly according to claim 5, wherein said joining member has a bottom end which comprises a flat, annular, inwardly-directed projection disposed parallel to said upper annular rim.

12. The assembly according to claim 11 wherein said flat, annular projection at the bottom end of said joining member corresponds in width to about 0.05 to 0.35 times the internal diameter of said crucible.

* * * * *

UNITED STATES PATENT AND TRADEMARK OFFICE
CERTIFICATE OF CORRECTION

PATENT NO. : 4,330,362
DATED : MAY 18, 1982
INVENTOR(S) : WERNER ZULEHNER

It is certified that error appears in the above—identified patent and that said Letters Patent is hereby corrected as shown below:

Column 3, line 7, "of" (second occurrence) should be --or--.
Column 7, lines 50-51, delete "crystalling"; line 34, change "is" to --it--; line 10, delete "during the". Column 8, line 28, change "1" to --5--; line 35, change "1" to --5--.

Signed and Sealed this

Twenty-sixth Day of July 1983.

[SEAL]

Attest:

GERALD J. MOSSINGHOFF

Attesting Officer           Commissioner of Patents and Trademarks